United States Patent [19]
Molin et al.

[11] Patent Number: 6,052,003
[45] Date of Patent: Apr. 18, 2000

[54] CMOS DELAY CIRCUIT

[75] Inventors: Stuart B. Molin, Oceanside; Paul A. Nygaard, Carlsbad, both of Calif.

[73] Assignee: Semtech Corporation, San Diego, Calif.

[21] Appl. No.: 09/071,352

[22] Filed: Apr. 30, 1998

[51] Int. Cl.[7] .............................. H03K 3/00; H03K 5/08; H03H 11/26

[52] U.S. Cl. ...................... 327/112; 327/264; 327/287; 327/321

[58] Field of Search ................... 326/83, 86; 327/108, 327/111, 112, 65, 423, 424, 336, 344, 91, 52, 263, 264, 266, 272, 274, 278, 280, 285, 287, 309, 318, 321, 331, 327, 328

[56] References Cited

U.S. PATENT DOCUMENTS

| | | |
|---|---|---|
| 4,641,048 | 2/1987 | Pollock .................................. 307/591 |
| 4,893,036 | 1/1990 | Hester et al. ........................... 307/603 |
| 5,121,014 | 6/1992 | Huang ..................................... 307/605 |
| 5,227,679 | 7/1993 | Woo ........................................ 307/469 |
| 5,231,320 | 7/1993 | Kase ....................................... 307/276 |
| 5,243,227 | 9/1993 | Guiterrez, Jr. et al. ................ 307/605 |
| 5,453,709 | 9/1995 | Tanimoto et al. ...................... 327/276 |
| 5,459,424 | 10/1995 | Hattori ................................... 327/278 |
| 5,506,534 | 4/1996 | Guo et al. .............................. 327/605 |
| 5,521,539 | 5/1996 | Molin ..................................... 327/274 |
| 5,554,945 | 9/1996 | Lee et al. ............................... 327/105 |
| 5,600,280 | 2/1997 | Zhang ....................................... 331/57 |
| 5,638,019 | 6/1997 | Frankeny ................................ 327/295 |

*Primary Examiner*—Toan Tran
*Attorney, Agent, or Firm*—Lyon & Lyon LLP

[57] ABSTRACT

A CMOS delay circuit for differential signals is provided. By adjusting the amplitude of clamping voltages, the delay period may be adjusted to a desired level. By using a single constant current source to charge both output nodes, current consumption is reduced.

22 Claims, 6 Drawing Sheets

CMOS DELAY CIRCUIT

I. BACKGROUND OF THE INVENTION

The present invention relates generally to a delay circuit, and more specifically to a delay circuit implemented in CMOS technology.

Delay circuits are used in conjunction with automated test equipment (ATE) to test integrated circuits (ICs). However, ATEs impose unique requirements upon a delay circuit. First, the circuit must be capable of delaying a rather narrow pulse for a significant period of time. Second, the circuit must be capable of maintaining both rising and falling edge accuracy. Third, the circuit must be capable of meeting stringent accuracy and stability requirements over a wide range of pulse frequencies, test patterns, and duty cycles.

CMOS technology is advantageous because of its low cost and low power consumption relative to other technologies such as bipolar. However, past attempts to design a delay circuit utilizing CMOS technology have not been entirely successful because of the variability in the propagation delay which has resulted, with factors such as voltage, temperature, and applied test pattern.

U.S. Pat. Nos. 4,893,036 and 5,521,539 describe differential signal delay circuits which are implemented in bipolar technology. However, these circuits utilize designs which consume excessive power, and also, particularly the circuit described in the foregoing U.S. Pat. No. 4,893,036, provide a fixed delay period that is not easily alterable by a user. Thus, such circuits have not been attractive candidates for implementation in CMOS technology in which the objective is to achieve low power consumption.

Accordingly, it is an object of the subject invention to provide a CMOS delay circuit which has stability, accuracy and noise immunity characteristics that make it suitable for use with ATEs.

Another object is to provide a CMOS delay circuit which provides a programmable delay.

A further object is to provide a differential input, constant current CMOS delay circuit with reduced power consumption compared to the prior art.

Further objects of the invention include utilization of the foregoing objects alone or in combination.

Additional advantages and objects will be set forth in the description which follows, or will be apparent to those of ordinary skill in the art who practice the invention.

II. SUMMARY OF THE INVENTION

To achieve the foregoing objects, and in accordance with the purpose of the invention as embodied and broadly described therein, there is provided a differential input, constant current delay circuit implemented in CMOS technology. In a second embodiment, the foregoing circuit is configured with adjustable clamping voltages. In a third embodiment, the foregoing circuit is configured with a single constant current source used to selectively charge both output nodes.

A delay circuit in accordance with the subject invention comprises: a first output node for providing a first output voltage; a second output node for providing a second output voltage which is a complement of the first output voltage; a first storage device coupled to the first output node; a second storage device coupled to the second output node; a first CMOS circuit coupled to the first output node for constraining the first output signal to swing between high and low voltages; a second CMOS circuit coupled to the second output node for constraining the second output signal to swing between high and low voltages; CMOS circuitry coupled to the first and second output nodes for charging a selected one of the first and second storage devices with current at a rate, and discharging the other of the first and second capacitors at substantially the same rate, responsive to first and second input signals which are complements of each other and which intersect at an intersection point; whereby the first and second output signals intersect at an intersection point which is delayed from the intersection point of the first and second input signals.

A related method comprises the following steps: transitioning a first input signal between a first selected one of a high and low state to a second selected one of a high and low state other than said first selected one; transitioning a second input signal which is a complement of the first input signal from the second selected one of the high and low states to the first selected one of the high and low states; intersecting the first and second input signals at an intersection point; responsive to the first input signal transitioning to the first selected one of a high and low state, utilizing at least in part CMOS technology to charge a first output node at a rate to a predetermined high level; responsive to the second input signal transitioning to the first selected one of a high and low state, utilizing at least in part CMOS technology to charge a second output node at substantially the same rate to the predetermined high level; responsive to the first input signal transitioning to the second selected one of a high and low state, utilizing at least in part CMOS technology to discharge the first output node at substantially the same rate to a predetermined low level; responsive to the second input signal transitioning the second selected one of a high and low state, utilizing at least in part CMOS technology to discharge the second output node at substantially the same rate to the predetermined low level; and intersecting first and second output voltages provided respectively at the first and second output nodes at an intersection point which is delayed relative to the intersection point of the first and second input signals.

IV. DESCRIPTION OF THE PREFERRED EMBODIMENTS

Figure 1:
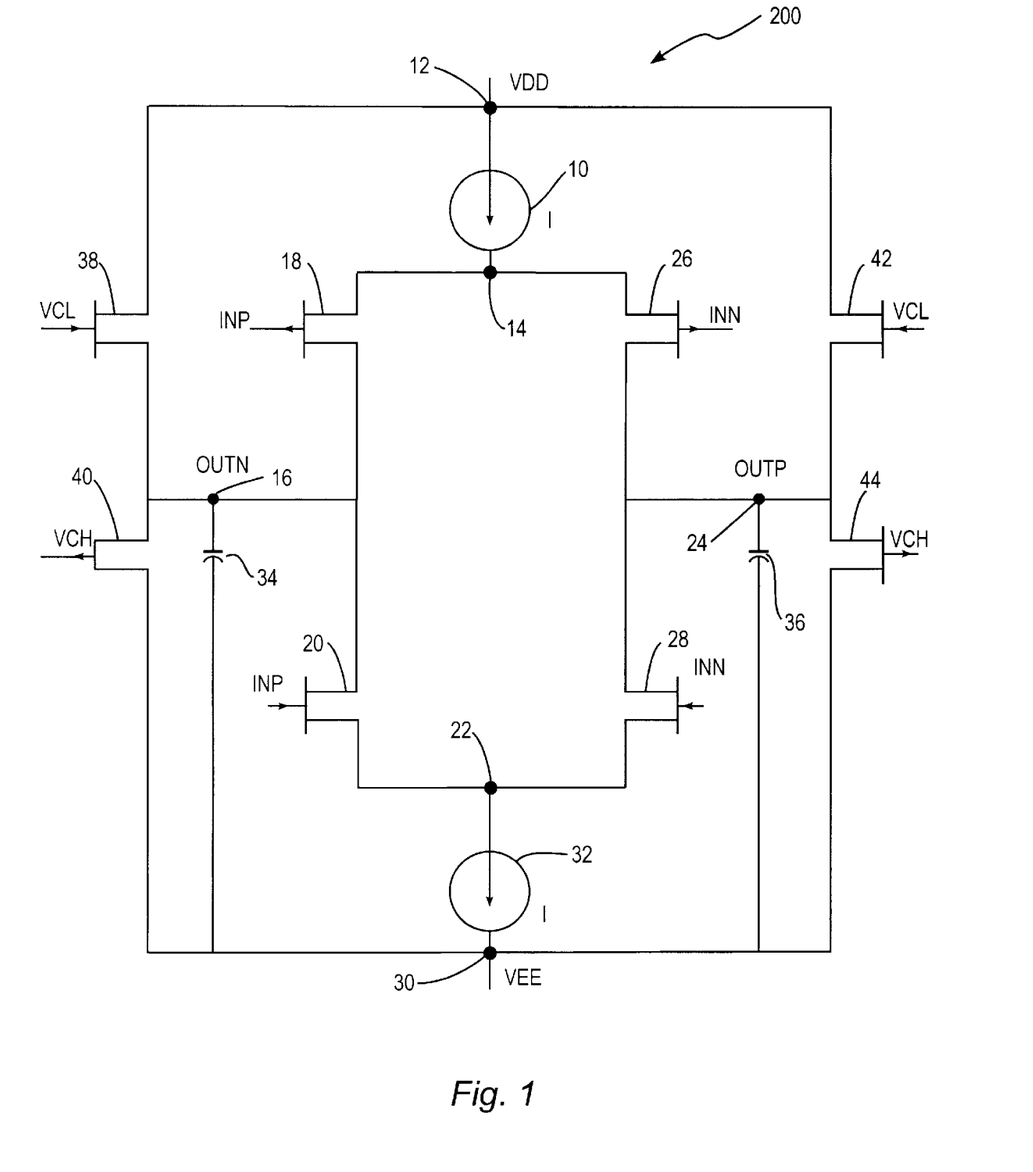
FIG. 1 is a schematic diagram of a preferred embodiment of the delay circuit of the present invention.

A first embodiment of the subject invention is illustrated in FIG. 1. As shown, a delay circuit 200 is provided which is implemented in CMOS technology. In addition, the circuit is configured as a differential input, constant current delay circuit in order to achieve accuracy and stability criteria that make it suitable for use with ATEs.

As shown, the circuit receives two primary inputs, INP and INN, which are in a complementary relationship to one another, and supplies two outputs, OUTP and OUTN, which also bear a complementary relationship to one another. The circuit also receives two secondary inputs, VCL and VCH, which determine the amount of the delay. In this first embodiment, the VCH and VCL inputs can be fixed or adjustable by a user.

The overall function of the circuit is to detect a crossover point between the two primary input signals, INP and INN, and to provide a crossover point on the two output signals, OUTP and OUTN, which occurs at a time which is a predetermined delay from the occurrence of the crossover point on the two primary input signals, and in which the amount of the delay is determined by the two secondary input signals, VCH and VCL.

This function can be explained with reference to FIGS. 3(a) and 3(b). FIG. 3(a) illustrates a crossover point, identified with numeral 300, between the two primary input signals, and FIG. 3(b) illustrates the corresponding crossover point, identified with numeral 301, between the two output signals. The delay between these two crossover points is equal to $\phi_1$.

In the particular example shown in FIG. 3(a), the crossover point 300 occurs as input signal INN transitions from a logical "1", identified with numeral 307 in the figure, to a logical "0", identified by numeral 308 in the figure, and as input signal INP transitions from a logical "0" to a logical "1". Advantageously, a logical "1" is equivalent to achieving a voltage of VDD, and a logical "0" is equivalent to achieving a voltage of VSS, but it should be appreciated that other assignments are possible. Moreover, it should be appreciated that operation of the circuit is also contemplated in the case in which the crossover point occurs through transitions of the signals INN and INP in directions opposite to that indicated above.

The amount of the delay is determined by the two secondary inputs, VCH and VCL, which are respectively the high and low clamping voltages. The high clamping voltage VCH determines the maximum extent either of the two output signals, OUTP or OUTN, can swing in a positive direction around mid-line 302, while the low clamping voltage VCL determines the maximum extent either of these two output signals can swing in a negative direction around mid-line 302. In FIG. 3(b), the maximum swing in the positive direction is identified with numeral 303, while the maximum swing in the negative direction is identified with numeral 304.

The effect of symmetrically increasing the values of the two clamping voltages VCH and VCL by equal amounts around the mid-line 302 is illustrated in FIG. 3(c). As can be seen, the maximum swing in the positive direction has been increased to 303', while the maximum swing in the negative direction has been increased to 304'. The effect of this is that the delay between the input and output crossover points has increased from $\phi_1$ to $\phi_2$ in direct proportion to the symmetrical and equal increase in the swing of the two output signals. Thus, it can be seen that a programmable or adjustable delay has been provided in which a user, merely by adjusting the values of the two clamping voltages, can achieve a corresponding adjustment in the amount of the delay.

Turning back to FIG. 1, the structure of the circuit 200 will now be described. As shown, a current source 10 provides a constant current I. (In this application, the term "constant current" is defined to mean a substantially constant current to account for slight variations in the amount of current which is supplied.) The current source 10 is connected between a positive voltage supply 12 (VDD) and a first node 14. A first current steering transistor 18 or switch is connected between first node 14 and second node 16. Advantageously, transistor 18 is a P-channel CMOS FET. As shown, the source of transistor 18 is connected to node 14 and the drain of transistor 18 is connected to node 16. The gate of current steering transistor 18 receives the input signal INP. A first input transistor 20 or switch is connected between second node 16 and a third node 22. Advantageously, transistor 20 is a N-channel CMOS FET. As shown, the source of input transistor 20 is connected to node 16 and the drain of transistor 20 is connected to node 22. Transistor 20 receives input signal INP at its gate also.

A second current steering transistor 26 or switch is connected between first node 14 and a fourth node 24. Advantageously, transistor 26 is a P-channel CMOS FET. Transistor 26 has a source connected to node 14 and a drain connected to node 24. Its gate receives input signal INN. A second input transistor 28 or switch has a source connected to fourth node 24 and a drain connected to third node 22. Advantageously, transistor 28 is a N-channel CMOS FET. It receives signal INN as an input to its gate.

A current sink 32 for sinking constant current I is connected between third node 22 and a negative power supply or ground 30 (VSS). A first capacitor 34 is connected between second node 16 and negative supply or ground 30 and a second capacitor 36 is connected between fourth node 24 and negative supply or ground 30.

A first low clamping transistor 38 is connected between positive voltage supply 12 and node 16 and receives VCL at its gate. A first high clamping transistor 40 is connected between node 16 and negative supply or ground 30 and receives VCH at its gate. Advantageously, transistor 38 is an N-channel CMOS FET, and transistor 40 is a P-channel CMOS FET. A second low clamping transistor 42 is connected between voltage supply 12 and node 24 and receives VCL at its gate. A second high clamping transistor 44 is connected between node 24 and ground or negative supply voltage 30 and receives VCH at its gate. Advantageously, transistor 42 is an N-channel CMOS FET and transistor 44 is a P-channel CMOS FET.

Node 16 is also the output node for OUTP and node 24 is the output node for OUTN. Voltages VCL and VCH are respectively the low and high clamping voltages in which VCL is greater than or equal to the negative supply voltage 30, and VCH is equal to or less than the supply voltage 12.

In the embodiment shown in FIG. 1, the specific conductivity type, whether N-channel or P-channel, of the input transistors 20 and 28 and current steering transistors 18 and 26 is not critical provided, however, that the conductivity of these transistors and the polarity of the input signals to the gates thereof are such that, in operation, when one of the current steering transistors, either 18 or 26, is conductive, that the other of the two current steering transistors be non-conductive, and the corresponding input transistor, either 20 or 28, be non-conductive. (In FIG. 1, the input transistor corresponding to a particular current steering transistor is connected to and on the same side of the circuit as the current steering transistor, i.e., transistor 20 corresponds to transistor 18, while transistor 28 corresponds to transistor 26.)

Thus, in FIG. 1, transistors 18 and 26 could be N-type as long as transistors 20 and 28 are P-type. Alternatively, transistors 18, 20, 26, and 28 could all be P-type provided that the input to the gate of transistor 20 is switched to INN, and the input to the gate of transistor 28 is switched to INP. Equivalently, transistors 18, 20, 26, and 28 could all be N-type provided that the input to transistor 18 is switched to INN, and the input to transistor 26 is switched to INP.

Figure 3:
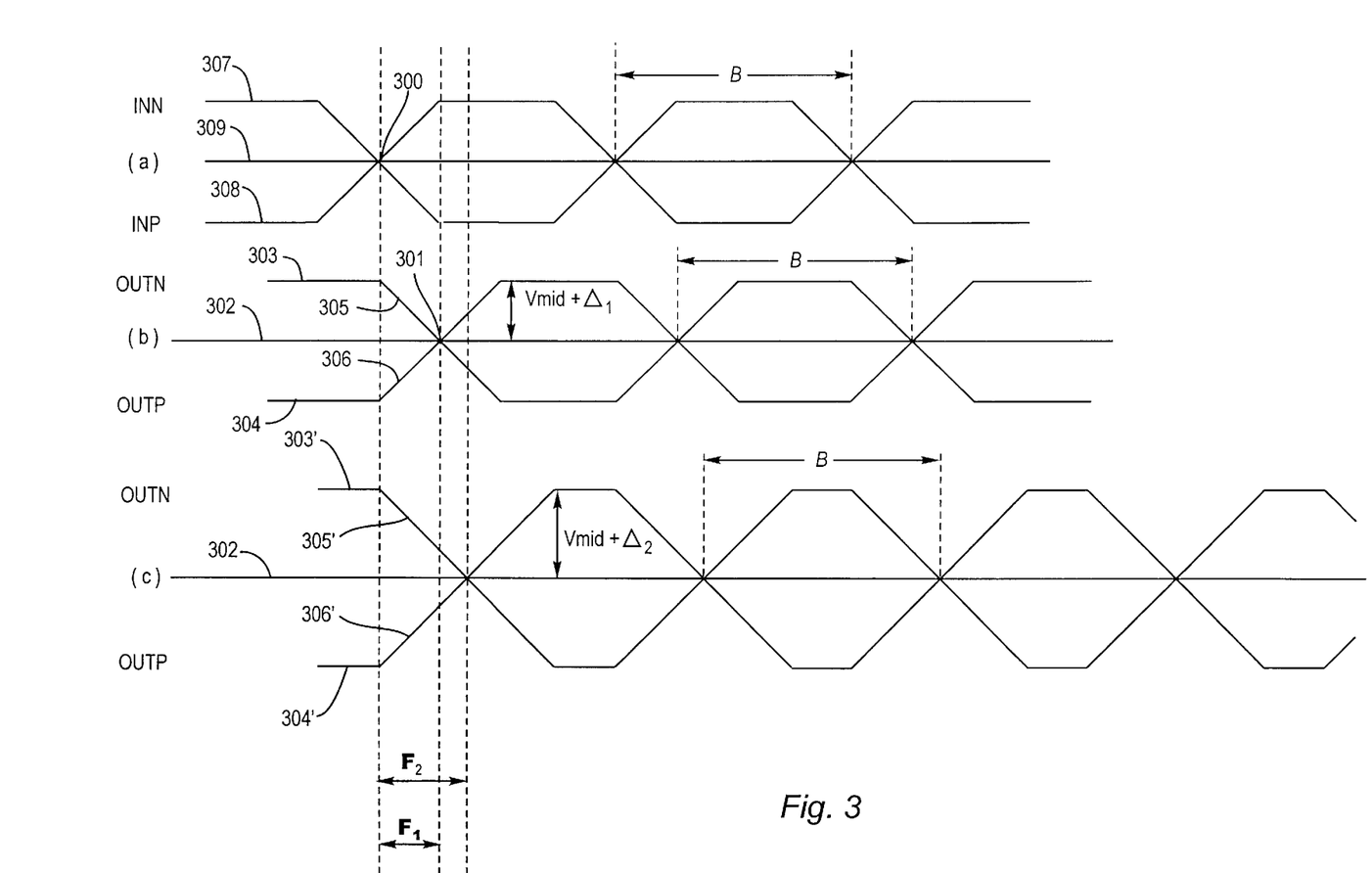
FIGS. 3(a) to (c) are timing charts illustrating the input and output signals of the circuit of FIG. 1.

In this first embodiment, in order to ensure that the slew rates of the OUTP and OUTN signals are mirror images of one another, i.e., that the slopes 305 and 306 shown in FIG. 3(*b*), and the slopes 305' and 306' shown in FIG. 3(*c*), are mirror images of each other around mid-line 302, transistor 18 is advantageously matched to transistor 26, transistor 20 is advantageously matched to transistor 28, transistor 38 is advantageously matched to transistor 42, and transistor 40 is advantageously matched to transistor 44, and capacitor 34 is advantageously matched to capacitor 36. (In this application, a transistor is "matched" to another transistor if the conductances thereof are substantially the same, and a capacitor is "matched" to another capacitor if the capacitances thereof are substantially the same.)

Although not illustrated, it should be appreciated that output nodes 16 and 24 may be connected to respective output buffer circuits to provide greater separation between stages of a cascaded array of delay circuits, and need not be further addressed here.

Also, although again not illustrated, it should be appreciated that it may be desirable to include level shifting circuitry to the circuit of FIG. 1 to account for the gate to drain threshold voltages of the transistors 38, 40, 42, and 44. Such circuits are well within the ambit of what is known to one of ordinary skill in the art, and need not be addressed further.

Figure 4:
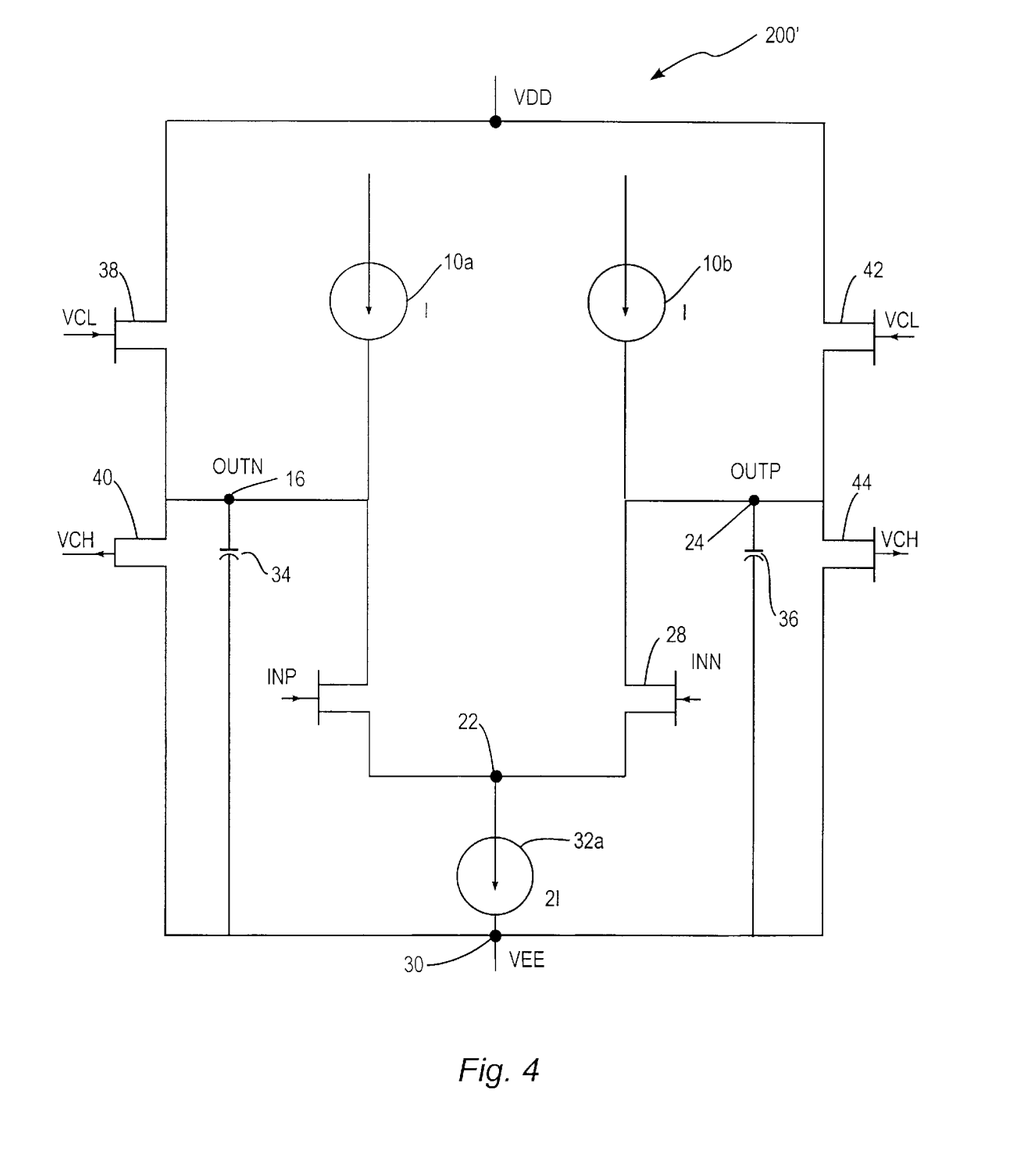
FIG. 4 illustrates a variant of the circuit of FIG. 1 in which each output node is configured with its own current source.

Finally, in this first embodiment, the number of current sources used to service the output nodes and charge the capacitors can be greater than one. FIG. 4 illustrates a variant of the circuit of FIG. 1 in which two current sources 10*a* and 10*b* are used to service output nodes 16 and 24, and charge capacitors 34 and 36. Note that in this variant, each output node is provided with its own current source. Thus, current steering transistors 18 and 26 illustrated in FIG. 1 need not be included in this variant. The operation of this variant is described in greater detail later in this application.

The operation of the circuit of FIG. 1 will now be described. As discussed, inputs INP and INN are complimentary digital inputs to be delayed. To begin the analysis, it is assumed that input INP is a logic "0" and input INN is a logic "1" and the signals have been constant for a sufficient period of time for the circuit to achieve steady state. As will become clear from the description below, in this state, the output at node 16 would be VCH and the output at node 24 would be VCL.

Specifically, in this steady state condition, looking at the left side of the circuit, current steering transistor 18 would be in a conductive state (e.g., "on") and input transistor 20 would be in a non-conductive state (e.g., "off"). As a result, current I from first current source 10 will flow through transistor 18 into capacitor 34, charging it until the voltage at node 16 becomes substantially equal to VCH. At that time, high clamping transistor 40 would begin conducting, thereby directing current away from capacitor 34 and into negative supply or ground 30.

In reality, transistor 40 would not begin conducting until the voltage at node 16 became equal to VCH plus the gate to source threshold voltage $V_{GS}$ of transistor 40. However, for simplicity herein, it will be assumed that $V_{GS}$ is negligible and can be ignored in the analysis. However, it should be appreciated that, in practice, a level shifter may be needed to adjust VCH and VCL to compensate for the gate to source voltage of transistor 40.

Considering the right side of circuit 200, current steering transistor 26 is non-conductive and input transistor 28 is conducting. Therefore, little, if any, current from source 10 would pass through current steering transistor 26. However, constant current source 32 is sinking current I directly to negative supply or ground 30. As a result, the current through transistor 28 must also be I. This results in capacitor 36 being discharged, at a rate I/C, through transistor 28 until the voltage at node 24 becomes substantially equal to VCL. At that time, low clamping transistor 42 would begin conducting and supply current I from supply voltage 12 through transistors 42 and 28 to current sink 32.

Again, it should be appreciated that transistor 24 will not begin conducting until the voltage at node 24 is equal to VCL minus the gate to drain threshold voltage of transistor 42. For simplicity of analysis, this voltage has been ignored, but in practice, it should be appreciated that it may be necessary to include a level shifting circuit to account for this voltage drop.

This state of affairs is illustrated in FIGS. 3(*a*) and 3(*b*), in which the steady state condition of INN at logical "1" is identified with numeral 307 in FIG. 3(*a*), the steady state condition of INP at logical "0" is identified with numeral 308 in FIG. 3(*a*), the steady state condition of OUTN at logical "1" is identified with numeral 303 in FIG. 3(*b*), and the steady state condition of OUTP at logical "0" is identified with numeral 304 in FIG. 3(*b*).

The next stage in the operation of the circuit occurs when inputs INP and INN reverse polarities (e.g., INP switches to logical "1" and INN switches to logical "0"). When this occurs, the state of the circuit of FIG. 1 changes as indicated conceptually in FIG. 2. Specifically, because transistors 20 and 26 are now in a conductive state, they may conceptually be considered as shorts. As transistors 18 and 28 are in a non-conductive state, they may conceptually be viewed as open switches.

Figure 2:
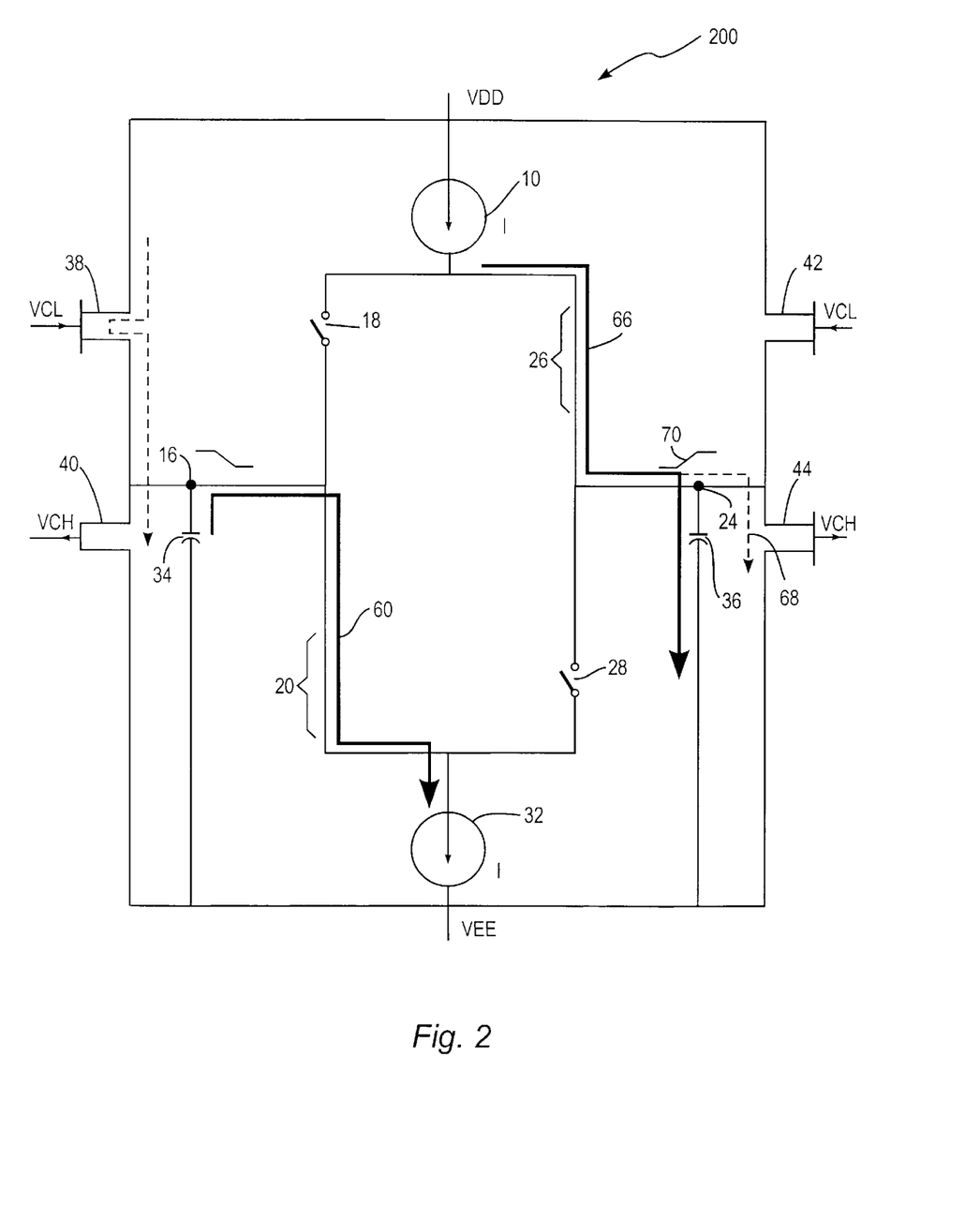
FIG. 2 is a conceptual diagram for illustrating current flow and voltage levels in the circuit of FIG. 1.

With reference to FIG. 2, because node 16 now has a direct path to ground through (closed) transistor 20 and current sink 32, capacitor 34 will begin to discharge as shown by bold line 60. Because constant current sink 32 is in series with capacitor 34, the current flow through capacitor 34 is necessarily I. This results in a constant rate of discharge of the voltage capacitor 34. (Again, the term "constant" in this application means substantially constant to account for slight changes in current flow that can occur in practice. This is determined from the equation I=C dV/dt. Because I is constant, dV/dt must also be constant.) Capacitor 34 will continue to discharge, in a linear fashion, until the voltage level at node 16 becomes substantially equal to VCL (again, after taking account of the gate to drain voltage of transistor 40). At that time, transistor 38 will begin conducting and supplying current from supply 12 to node 16 at a constant current I (see dotted current line 62). Thus, as illustrated by voltage diagram 64, the voltage at node 16 will fall in a linear fashion from VCH to VCL.

Considering the right side of the circuit, because current steering transistor 26 is conductive (e.g., closed) and input transistor 28 is non-conductive (e.g., open), current I from current source 10 will flow through (closed) transistor 26, and charge capacitor 36 (see bold line 66). As a result, capacitor 36 will charge until it substantially equals VCH (again, after taking account of the gate to drain threshold voltage for transistor 44), at which time transistor 44 will begin to conduct thereby drawing current away from capacitor 36, and thus regulating the voltage at node 24 to about VCH (see dotted line 68). Therefore, the voltage at output node 24 will rise in a linear fashion from VCL to VCH.

The foregoing transitions are illustrated in FIGS. 3(a) and 3(b). FIG. 3(a) illustrates the transition of INN from logical "1" to logical "0", the transition of INP from logical "0" to logical "1", and the crossover point between the two signals, identified with numeral 300.

FIG. 3(b) illustrates the transition of OUTN from VCH to VCL, the transition of OUTP from VCL to VCH, and the crossover point between the two signals, identified with numeral 301 in the figure.

As will be apparent to those skilled in the art, as the inputs INP and INN reverse plurality again, the same process will be repeated only in reverse, i.e., capacitor 34 will charge and INN will rise to about VCH, while capacitor 36 will discharge, and INP will drop to about VCL. Again, the resultant delay introduced by the circuit between these two crossover points is identified with $\phi_4$.

It should be appreciated that the larger the potential difference there is between VCL and VCH, the longer the delay between the two crossover points. This is true because the rate of change of the voltage (dV/dt) across capacitors 34 and 36 is I/C, a constant. Thus, comparing FIG. 3(c) to FIG. 3(b), when VCH is increased from the level 303 to 303', and VCL is decreased from level 304 to 304', the delay introduced by the circuit increases from $\phi_1$ to $\phi_2$.

It should further be appreciated that the circuit of FIG. 1 possesses several advantages over the prior art. First, since it is implemented in CMOS, it retains the cost advantages of CMOS in relation to other technologies such as bipolar. Second, because it is a differential input, constant current circuit, it possesses superior stability, accuracy, and noise immunity properties even though implemented in CMOS. This can best be illustrated by reference to FIGS. 3(a)–3(c). There, it can be seen that the delay which is achieved is determined by the slope of lines 305 and 306 in FIG. 3(b) and lines 305' and 306' in FIG. 3(c), which has an absolute value equal to I/C, a constant. Thus, the delay which is achieved is substantially invariant to the propagation time through the CMOS gates.

In addition, noise which is introduced will likely equally affect lines 305 and 306 in FIG. 3(b), and lines 305' and 306' in FIG. 3(c). Thus, the delay which is achieved, which is determined by the crossover of these two lines, will be substantially immune to any such noise.

Finally, the period from cross-over to cross-over in each of FIGS. 3(a) to 3(c) is substantially the same period B. Therefore, pulse width accuracy is maintained in the delayed signal, regardless of the period of delay selected.

A second embodiment of the invention comprises the foregoing delay circuit but configured with means to allow VCL and VCH to be selectively adjustable or programmable by a user. Advantageously, the means is configured to allow these signals to be adjusted symmetrically about a preselected middle voltage point (e.g., $V_{mid}$); that is, VCL= $V_{mid}-\Delta$ and VCH= $V_{mid}+\Delta$, where $\Delta$ is a user adjustable value. Symmetrical adjustment of VCL and VCH allows the cross-over points of the complementary output signals OUTP and OUTN to occur at the same level (e.g., $V_{mid}$). Another advantage of this approach is that it facilitates connecting a plurality of such delay circuits in series in a cascade arrangement to achieve a delay greater than any single circuit could provide. In such an arrangement, the complementary output signals from one stage, OUTP and OUTN, comprise the complementary inputs to the next stage, INP and INN.

Referring again to FIGS. 3(a)–(c), FIG. 3(a) illustrates the input pattern of signals INP and INN, and FIG. 3(b) illustrates the delayed outputs OUTP and OUTN that are achieved from the circuit of FIG. 1 when VCL=$V_{mid}-\Delta_1$ and VCH=$V_{mid}+\Delta_1$. As shown, the crossover point illustrated in FIG. 3(b) lags the crossover point illustrated in FIG. 3(a) by a period $\phi_1$. FIG. 3(c) illustrates the delayed outputs OUTP and OUTN that are achieved from the circuit of FIG. 1 when VCL=$V_{mid}-\Delta_2$ and VCH=$V_{mid}+\Delta_2$, where $\Delta_2>\Delta_1$. As shown, the signals of FIG. 3(c) lag the signals of FIG. 3(a) by a period $\phi_2$, which is longer than period $\phi_1$. Thus, as before, the delay period that is achieved in the circuit of this embodiment is directly proportional to the amplitudes of VCH and VCL.

Figure 5:
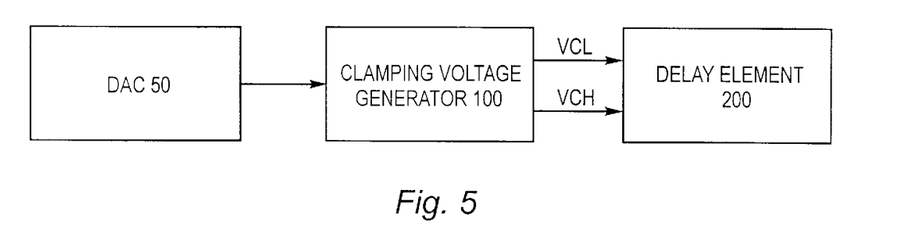
FIG. 5 is a block level diagram of a system illustrating the means by which a user can adjust the clamping voltages used in the circuit of the subject invention.

Referring to FIG. 5, in which compared to FIG. 1, like elements are referred to with like identifying numerals, a means for adjusting the delay through corresponding changes in the VCH and VCL threshold voltages is illustrated. Delay element 200 is connected to a clamping voltage generator 100 which in turn is connected to a digital to analog convertor (DAC) 50.

In operation, a user selects a desired delay amount by supplying a digital signal to DAC 50. A corresponding analog signal is then supplied to clamping voltage generator 100, which generates the corresponding $\Delta$ value in response to this signal. It also generates voltages VCL and VCH, in accordance with the calculated $\Delta$ value and a predetermined $V_{mid}$ value, which may also be selected by the user through DAC 50. Signals VCL and VCH are then supplied to delay element 200, the operation of which has been previously described. Through this means, a user desiring to change the delay which is achieved need only change the digital signal which is supplied to DAC 50.

Figure 6:
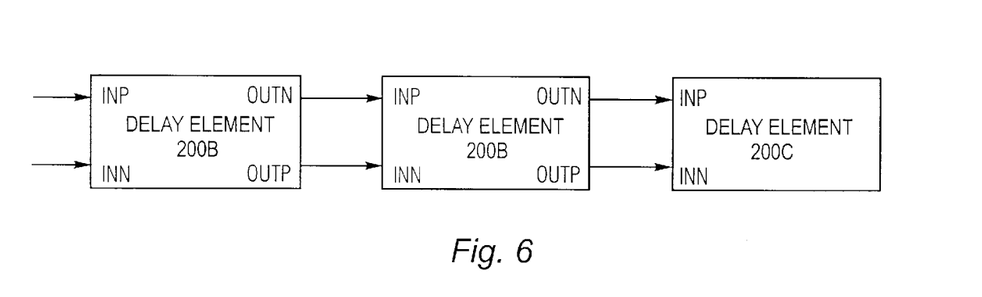
FIG. 6 is a block level diagram of a cascaded plurality of delay elements.

FIG. 6 illustrates a cascaded plurality of delay elements 200A, 200B and 200C connected in series. As illustrated, the outputs OUTP and OUTN of one stage form inputs INN and INP of the next stage.

A third embodiment comprises the foregoing delay circuit of the first embodiment except that only one current source is provided to service both of the output nodes 16 and 24. This is to be contrasted with a delay circuit, such as that illustrated in FIG. 4, which is part of the first embodiment, in which each output node is serviced with its own current source.

With reference to FIG. 4, in which, compared to FIG. 1, like elements are referenced with like identifying numerals, delay element 200' has two separate constant currents supplies 10a and 10b, each supplying current I, provided respectively between supply voltage 12 and node 16 and supply voltage 12 and node 24. The use of two current supplies obviates the need for current steering transistors 18 and 26. In addition, constant current sink 32 is replaced with constant current sink 32a supplying 2I of current.

As will be appreciated by those skilled in the art, the operation of this circuit is substantially similar to that in FIG. 1. The main difference is the amount of current which is consumed during an operating cycle; the circuit of FIG. 4 consuming twice as much current as the circuit of FIG. 1.

To see why this is so, consider the circuit of FIG. 4 during the portion of the operating cycle in which output node 16 is discharging, and output node 24 is charging. The current I from current source 10b is used to charge up capacitor 36. However, the current I from current source 10a is passed to ground through (closed) transistor 20 and current sink 32a, and is thus wasted. The current 2I passing through current sink 32a is derived from the current which results from the discharge of capacitor 34 and the current I from current source 10a.

In contrast, in the circuit of FIG. 1, only one current source 10 is provided to service both output nodes 16 and 24. Thus, when node 24 is charging up, as illustrated in FIG. 2, the current I from current source 10 is used to charge capacitor 36, and (open) transistor 18 prevents any of this current from being passed to ground through (closed) transistor 20 and current sink 32, and thus wasted. Instead, the current I which is passed through current sink 32 is derived entirely from the discharge of capacitor 34.

EXAMPLE

Figure 7:
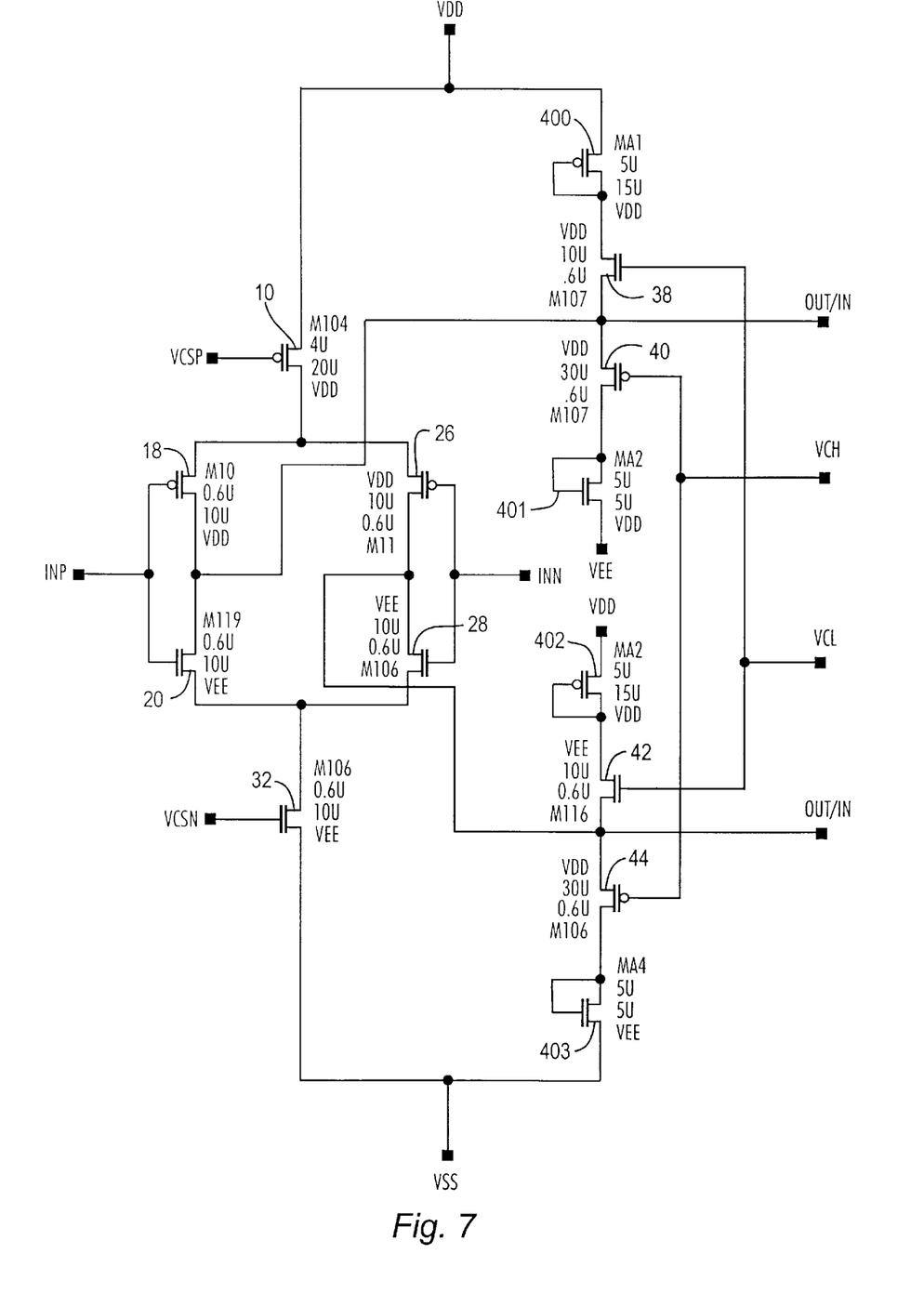
FIG. 7 is an example of a circuit embodying the subject invention.

An example of a circuit embodying the subject invention is illustrated in FIG. 7. In FIG. 7, compared with FIG. 1, like elements are referenced with like identifying numerals. The additional elements shown in FIG. 7 are level shifters 400–403, added to take account of the gate to drain voltages of transistors 28, 36, 38, and 40. Not shown in FIG. 7 are capacitors 34 and 36. The physical characteristics of the transistors identified are provided in the following table:

| Transistor | Length (microns) | Width (microns) |
| --- | --- | --- |
| 10 | 4 | 20 |
| 18 | .6 | 10 |
| 26 | .6 | 10 |
| 20 | .6 | 10 |
| 28 | .6 | 10 |
| 32 | 10 | 20 |
| 400 | 5 | 15 |
| 38 | .6 | 10 |
| 40 | .6 | 30 |
| 401 | 5 | 5 |
| 402 | 5 | 15 |
| 42 | .6 | 10 |
| 44 | .6 | 30 |
| 403 | 5 | 5 |

The values of the capacitors 34 and 36 in this example are 0.02 pF.

While embodiments and applications of this invention have been shown and described, it should be apparent to those of ordinary skill in the art that many other embodiments, variants, or modifications thereof are possible without departing from the spirit and scope of the subject invention. Accordingly, the invention is not to be restricted, except as by the appended claims.

What is claimed is:

1. A delay circuit comprising:

a current source connected between a first voltage source and a first node;

a first CMOS transistor having a conductivity type and having a current path connected at one end to the first node and a second end connected to a second node, and having a gate for receiving a first input;

a second CMOS transistor having a conductivity opposite to that of the first CMOS transistor and having a current path connected at one end to the second node and a second end connected to a third node, and having a gate for receiving the first input;

a third CMOS transistor having a conductivity type and having a current path connected at one end to the first node and a second end connected to a fourth node, and having a gate for receiving a second input;

a fourth CMOS transistor having a conductivity opposite to that of the third transistor and having current path connected at one end to the fourth node and a second end connected to the third node, and having a gate for receiving the second input;

a current sink connected between said third node and the second voltage source;

a first capacitor connected between said second node and a second voltage source;

a second capacitor connected between said fourth node and the second voltage source;

a fifth CMOS transistor having a current path connected at one end to the first voltage source and a second end to the second node, and having a gate for receiving a first clamping voltage;

a sixth CMOS transistor having a current path connected at one end to the second node and a second end connected to the second voltage source, and having a gate for receiving a second clamping voltage;

a seventh CMOS transistor having a current path connected at one end to the first voltage source and a second end connected to the fourth node, and having a gate for receiving the first clamping voltage; and an eighth CMOS transistor having a current path connected at one end to the fourth node and a second end connected to the second voltage source, and having a gate for receiving the second clamping voltage, wherein said second and fourth nodes comprise output nodes.

2. The circuit of claim 1 in which the second voltage source is ground.

3. A delay circuit comprising:

at least one constant current source;

a constant current sink;

a first output node for providing a first output signal;

a second output node for providing a second output signal;

a first capacitor coupled to the first output node;

a second capacitor coupled to the second output node;

a first switchable current path extending from the at least one constant current source to the first capacitor and to the current sink;

a second switchable current path extending from the at least one constant current source to the second capacitor and to the current sink;

at least one CMOS switch coupled to the first and second current paths and configured to selectively allow passage of current from a selected one of said first and second capacitors to said current sink through a corresponding one of said first and second current paths, and to block passage of current from said at least one current source to said current sink through a selected one of said first and second current paths other than said corresponding one, responsive to at least one input signal;

at least one first CMOS voltage clamper connected to the first output node for constraining the first output signal to swing between first and second voltages; and at least one second CMOS voltage clamper connected to the second output node for constraining the second output signal to swing between said first and second voltages.

4. The circuit of claim 3 in which the at least one current source comprises a single current source, and the at least one CMOS switch includes first and second CMOS switches coupled respectively to the first and second current paths and configured to selectively switch current from the constant current source to a first selected one of the first and second capacitors, and block current from the constant current source to a second selected one of said first and second capacitors other than said first selected one, responsive to at least one input signal.

5. The circuit of claim 3 in which the at least one current source comprises first and second current sources, the first current path extends from the first current source to the first capacitor and to the current sink, and the second current path extends from the second current source to the second capacitor and to the current sink.

6. A delay circuit comprising:
   a constant current source;
   a constant current sink;
   a first output node for providing a first output signal;
   a second output node for providing a second output signal;
   a first capacitor coupled to the first output node;
   a second capacitor coupled to the second output node;
   a first switchable current path extending from the constant current source to the first capacitor;
   a second switchable current path extending from the constant current source to the second capacitor;
   a third switchable current path extending from the first capacitor to the current sink;
   a fourth switchable current path extending from the second capacitor to the current sink;
   at least one first CMOS switch coupled to the first and second current paths and configured to selectively switch current from the constant current source to a first selected one of the first and second capacitors, and block current from the constant current source to a second selected one of said first and second capacitors other than said first selected one, responsive to at least one input signal;
   at least one second CMOS switch coupled to the third and fourth current paths and configured to selectively allow passage of current from the second selected one of said first and second capacitors to said current sink through a corresponding one of said third and fourth current paths, and to block passage of current from said current source to said current sink through one of said third and fourth current paths other than said corresponding one, responsive to said at least one input signal;
   at least one first CMOS voltage clamper connected to the first output node for constraining the first output signal to swing within a predetermined voltage range defined by high and low voltages; and
   at least one second CMOS voltage clamper connected to the second output node for constraining the second output signal to swing within the predetermined voltage range.

7. A delay circuit comprising:
   a first output node for providing a first output voltage;
   a second output node for providing a second output voltage which is a complement of the first output voltage;
   a first storage device coupled to the first output node;
   a second storage device coupled to the second output node;
   a first CMOS circuit coupled to the first output node for constraining the first output signal to swing between high and low voltages;
   a second CMOS circuit coupled to the second output node for constraining the second output signal to swing between said high and low voltages;
   CMOS circuitry coupled to the first and second output nodes for charging a selected one of the first and second storage devices with current at a rate, and discharging the other of the first and second capacitors at substantially the same rate, responsive to first and second input signals which are complements of each other and which intersect at an intersection point;
   whereby the first and second output signals intersect at an intersection point which is delayed from the intersection point of the first and second input signals.

8. A delay system comprising:
   a first output node for providing a first output voltage;
   a second output node for providing a second output voltage which is a complement of the first output voltage;
   a first storage device coupled to the first output node;
   a second storage device coupled to the second output node;
   a first CMOS circuit coupled to the first output node for constraining the first output signal to swing between high and low voltages;
   a second CMOS circuit coupled to the second output node for constraining the second output signal to swing between said high and low voltages;
   CMOS circuitry coupled to the first and second output nodes for charging a selected one of the first and second storage devices with current at a rate, and discharging the other of the first and second capacitors at substantially the same rate, responsive to first and second input signals which are complements of each other and which intersect at an intersection point; and
   circuitry for generating the high and low voltages responsive to at least one signal representative of a desired delay;
   whereby the first and second output signals intersect at an intersection point which is delayed from the intersection point of the first and second input signals.

9. The system of claim 8 in which the circuitry for generating high and low voltages comprises:
   a digital-to-analog converter; and
   a clamping voltage generator coupled to the digital-to-analog converter.

10. A delay system comprising:
    at least one constant current source;
    a constant current sink;
    a first output node for providing a first output signal;
    a second output node for providing a second output signal;
    a first capacitor coupled to the first output node;
    a second capacitor coupled to the second output node;
    a first switchable current path extending from the at least one constant current source to the first capacitor and to the current sink;
    a second switchable current path extending from the at least one constant current source to the second capacitor and to the current sink;
    at least one CMOS switch coupled to the first and second current paths and configured to selectively allow passage of current from a selected one of said first and second capacitors to said current sink through a corresponding one of said first and second current paths, and to block passage of current from said at least one current source to said current sink through a selected one of said first and second current paths other than said corresponding one, responsive to at least one input signal;

at least one first CMOS voltage clamper connected to the first output node for constraining the first output signal to swing between first and second voltages;

at least one second CMOS voltage clamper connected to the second output node for constraining the second output signal to swing between said first and second voltages; and circuitry for generating the first and second voltages responsive to a signal representative of a desired delay.

11. The system of claim 10 in which the circuitry for generating the first and second voltages is responsive to a signal representative of a deviation around a predetermined midpoint, and the first voltage is generated to be the predetermined midpoint plus the deviation, and the second voltage is generated to be the predetermined midpoint minus the deviation.

12. A method of delaying an input signal comprising:

providing first and second input signals which are complements of each other;

responsive to the first input signal transitioning to a low state, directing current from a constant current source to a first capacitor coupled to a first output node, thus charging the first output node at a first linear rate to a predetermined high level;

clamping the first output node at the predetermined high level;

responsive to the second input signal transitioning to a high state, discharging current from a second capacitor coupled to a second output node to a constant current sink, thus discharging the second output node at a second linear rate to a predetermined low level;

clamping the second output node at the predetermined low level; and intersecting first and second output voltages provided respectively at the first and second output nodes at an intersection point which is delayed relative to an intersection point of the first and second input signals.

13. The method of claim 12 in which the first and second linear rates are substantially equal.

14. The method of claim 12 wherein said predetermined high and low levels are symmetrical about a predetermined middle level.

15. A delay circuit system comprising a plurality of delay circuits according to claim 1 connected in series.

16. A method of delaying an input signal comprising:

transitioning a first input signal between a first selected one of a high and low state to a second selected one of a high and low state other than said first selected one;

transitioning a second input signal which is a complement of the first input signal from the second selected one of the high and low states to the first selected one of the high and low states;

intersecting the first and second input signals at an intersection point;

responsive to the first input signal transitioning to the first selected one of a high and low state, utilizing a constant current source to charge a first output node at a linear rate to a predetermined high level;

clamping the first output node at the predetermined high level;

responsive to the second input signal transitioning to the first selected one of a high and low state, utilizing the constant current source to charge a second output node at substantially the same liner rate to the predetermined high level;

clamping the second output node at the predetermined high level;

responsive to the first input signal transitioning to the second selected one of a high and low state, discharging the first output node at substantially the same linear rate to a predetermined low level;

clamping the first output node at the predetermined low level;

responsive to the second input signal transitioning the second selected one of a high and low state, discharging the second output node at substantially the same linear rate to the predetermined low level;

clamping the second output node at the predetermined low level; and intersecting first and second output voltages provided respectively at the first and second output nodes at an intersection point which is delayed relative to the intersection point of the first and second input signals.

17. The method of claim 16 in which the steps thereof occur in CMOS technology.

18. The method of claim 16 further comprising:

determining the predetermined high level in accordance with a desired delay; and determining the predetermined low level in accordance with a desired delay.

19. The method of claim 16 further comprising:

determining a deviation about a predetermined midpoint in accordance with a desired delay;

determining the predetermined high level to be the predetermined midpoint plus the deviation; and determining the predetermined low level to be the predetermined midpoint minus the deviation.

20. A method of delaying an input signal using CMOS technology comprising:

transitioning a first input signal between a first selected one of a high and low state to a second selected one of a high and low state other than said first selected one;

transitioning a second input signal which is a complement of the first input signal from the second selected one of the high and low states to the first selected one of the high and low states;

intersecting the first and second input signals at an intersection point;

responsive to the first input signal transitioning to the first selected one of a high and low state, utilizing at least in part CMOS technology to charge a first output node at a rate to a predetermined high level;

clamping the first output node at the predetermined high level;

responsive to the second input signal transitioning to the first selected one of a high and low state, utilizing at least in part CMOS technology to charge a second output node at substantially the same rate to the predetermined high level;

clamping the second output node at the predetermined high level;

responsive to the first input signal transitioning to the second selected one of a high and low state, utilizing at least in part CMOS technology to discharge the first output node at substantially the same rate to a predetermined low level;

clamping the first output node at the predetermined low level;

responsive to the second input signal transitioning the second selected one of a high and low state, utilizing at least in part CMOS technology to discharge the second output node at substantially the same rate to the predetermined low level;

clamping the second output node at the predetermined low level; and intersecting first and second output voltages provided respectively at the first and second output nodes at an intersection point which is delayed relative to the intersection point of the first and second input signals.

21. The circuit of claim 7 in which the first and second storage devices are capacitors.

22. The method of claim 20 in which the rate is a substantially linear rate.

* * * * *